United States Patent
Ogino et al.

[11] Patent Number: 5,243,144
[45] Date of Patent: Sep. 7, 1993

[54] WIRING BOARD AND PROCESS FOR PRODUCING THE SAME

[75] Inventors: Haruo Ogino, Tochigi; Hiroharu Kamiyama, Shimodate; Akishi Nakaso, Oyama, all of Japan

[73] Assignee: Hitachi Chemical Company, Ltd., Tokyo, Japan

[21] Appl. No.: 446,816

[22] Filed: Dec. 6, 1989

[30] Foreign Application Priority Data

Dec. 9, 1988 [JP] Japan .................. 63-312590

[51] Int. Cl.⁵ .............................................. H05K 1/00
[52] U.S. Cl. ........................... 174/266; 174/262; 361/792
[58] Field of Search ............. 174/262, 266, 260; 361/397, 414, 406; 427/96, 97; 29/852, 853; 156/630, 632

[56] References Cited

U.S. PATENT DOCUMENTS

| | | | |
|---|---|---|---|
| 3,243,498 | 3/1966 | Allen et al. | 174/266 |
| 3,301,939 | 1/1967 | Krasnow | 174/266 |
| 3,348,990 | 10/1967 | Zimmerman et al. | 361/414 |
| 3,739,469 | 6/1973 | Dougherty, Jr. | 361/414 |
| 4,770,900 | 9/1988 | Seibel | 427/97 |
| 4,791,722 | 12/1988 | Miller, Jr. | 174/266 |
| 4,792,646 | 12/1988 | Enomoto | 174/266 |

FOREIGN PATENT DOCUMENTS

| | | |
|---|---|---|
| 0052738 | 6/1982 | European Pat. Off. |
| 0169530 | 1/1986 | European Pat. Off. |
| 1212362 | 11/1970 | United Kingdom |
| 1229220 | 4/1971 | United Kingdom |
| 1535813 | 12/1978 | United Kingdom |
| 2030007 | 3/1980 | United Kingdom |
| 2092830 | 8/1982 | United Kingdom |
| 2115985 | 9/1983 | United Kingdom |
| 2145573 | 3/1985 | United Kingdom |
| 2118369 | 10/1986 | United Kingdom |

*Primary Examiner*—Leo P. Picard
*Assistant Examiner*—Trinidad Korka
*Attorney, Agent, or Firm*—Antonelli, Terry, Stout & Kraus

[57] ABSTRACT

A circuit board having holes (a) and holes (b) therein with different electrically connecting structures and enlarged connecting areas with respect to an insulating substrate and circuit conductors formed on the insulating substrate is excellent in connection reliability and high in wiring density.

2 Claims, 7 Drawing Sheets

WIRING BOARD AND PROCESS FOR PRODUCING THE SAME

BACKGROUND OF THE INVENTION

This invention relates to a wiring board excellent in connection reliability and a process for producing the same.

A wiring board usually has a plurality of circuit conductors, and through-holes having metallized inner walls in portions necessary for connecting individual layers when the circuit conductors are formed on a plurality of layers.

Such a wiring board is mainly produced by a subtractive process or an additive process. The subtractive process comprises drilling or punching holes in an insulating substrate having conductors on the whole surfaces for connection on necessary portions, forming a metal on inner walls of the holes and the surface conductors by electroless plating or electrical plating, covering portions necessary for circuits with an etching resist, and removing exposed metal by etching to produce a wiring board. On the other hand, the additive process comprises drilling or punching holes on necessary portions for connection in an insulating plate, forming a plating resist so as to expose inner walls of the holes and portions necessary for forming circuits, and forming a metal on the inner walls of holes and the portions necessary for forming circuits.

Further, Japanese Patent Examined Publication (JP-B) No. 50-40466 discloses a process as shown in FIGS. 6(A) to 6(D) comprising forming conductor circuits 3 on surfaces of an insulating substrate 1 (FIG. 6(A)), covering the surfaces thereof with protective films 15 (FIG. 6(B)), drilling a hole 12 in the insulating substrate together with the circuit conductors (FIG. 6(C)), and forming a metal layer 14 on the inner wall of the hole 12 by electroless plating (FIG. 6(D)).

Still further, Japanese Patent Unexamined Publication (JP-A) No. 61-176193 discloses a process as shown in FIGS. 7(A) to 7(E) comprising removing a conductor in a size of through-hole diameter from portions 18 of a circuit conductor 3 on a front side necessary for connecting to a circuit of back side of a double-sided copper-clad laminate 17 (FIG. 7(A) and retaining a conductor on the back side corresponding to the connecting portions 18 to form patterns in desired form (FIG. 7(B)), forming a plating resist 25 on both sides (FIG. 7(C)), irradiating the connecting portions 18 on the front side with a laser light until the conductor of the circuit conductor 3 of the back side is exposed and removing the plating resist around the connecting portions 18 with the laser light (FIG. 7(D)), and forming an electroless plated film 24 on the inner walls of the holes and around the surface portions thereof together with the exposed portions of the circuit conductor 3 of the back side to produce a wiring board (FIG. 7(E)).

According to known subtractive processes and additive processes, since drilling or punching of through-holes is carried out at an initial stage of the production processes, fabricating conditions in the later steps for conductor circuits to be connected with the through-holes are remarkably limited in order to maintain the relation to the through-holes constant. For example, when a pattern called as a land which connects a through-hole and a circuit conductor is formed on a photomask which is a means for forming an etching resist, there must be taken into consideration expansion and contraction of the photomask and the insulating substrate used therein as well as an error of register at the time of working.

This becomes also a limiting factor in the formation of through-holes and a resist for electroless plating in the additive process.

Such a problem of hole positions in the subtractive processes and the additive processes does not take place in the process of the above-mentioned JP-B 50-40466. But, in recent wiring boards having a high wiring density, finer circuit conductors are also required. Thus, when such wiring boards are produced by the process of JP-B 50-40466, since the connecting area between a through-hole and a circuit conductor portion is small, break of circuits due to thermal stress readily takes place, which could not be expected from known wiring boards having low wiring density and results in producing a problem of lowering in connection reliability.

Further, when a laser light is used for forming holes as JP-A 61-176193, the problem of connection reliability and wiring density can be solved. But in the production of multi-layer wiring boards, there arise various problems in that it is necessary to laminate a plurality of double-sided wiring boards thus treated, to form holes necessary for connection and to make inner walls of through-holes electroconductive, an apparatus for forming holes at desired locations using a laser light is expensive, and the like.

SUMMARY OF THE INVENTION

It is objects of the present invention to provide a wiring board excellent in connection reliability and high in wiring density and a process for producing such a wiring board economically and easily in spite of the number of laminated wiring layers.

The present invention provides a wiring board comprising an insulating substrate, circuit conductors formed on both sides of the insulating substrate, at least one hole (a) formed at a desired portion only through the insulating substrate, a circuit conductor (a) formed on the whole inner wall of the hole (a) and a part of surfaces of the insulating substrate around the hole (a) in connection with the inner wall of hole (a), at least one hole (b) formed at a desired portion through the insulating substrate and the circuit conductors formed on the insulating substrate, and a circuit conductor (b) formed on the whole inner wall of the hole (b) and a part of the circuit conductors formed on the insulating substrate around the hole (b) in connection with the inner wall of hole (b).

The present invention also provides process for producing the wiring board mentioned above, which comprises a step of forming desired circuit conductors on surfaces of an insulating substrate, a step of forming a protective film on the whole surfaces of the insulating substrate having the circuit conductors thereon, a step of drilling or punching holes (a) and (b), a step of removing the protective film around the holes (a) and (b) in a desired range, a step of forming a circuit conductor (a) on the whole inner wall of the hole (a) and a part of surfaces of the insulating substrate around the hole (a) in connection with the inner wall of hole (a) and forming a circuit conductor (b) on the whole inner wall of the hole (b) and a part of the circuit conductors formed on the insulating substrate around the hole (b) in connection with the inner wall of hole (b), and a step of removing the rest of protective film.

DESCRIPTION OF THE PREFERRED EMBODIMENTS

Figure 1:
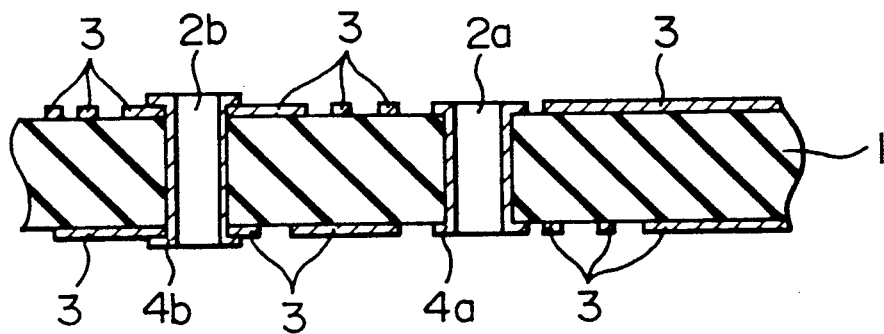
FIG. 1 is a cross-sectional view of one example of the wiring boards of the present invention.

According to the present invention, there is provided a wiring board having a structure characterized by having enlarged connecting areas between through-holes and circuit conductors and different connecting structures. Further, there is also provided a process for producing such a wiring board characterized by fabricating circuit conductors first, drilling or punching through-holes, and forming conductors on the whole inner walls of the through-holes and around portions of the through-holes in connection in different structures.

The present invention is explained referring to the drawings.

As shown in FIG. 1, the wiring board of the present invention comprises an insulating substrate 1, a plurality of circuit conductors 3 formed on both sides of the insulating substrate, a plurality of holes (a) 2a at desired portions through only the insulating substrate 1, a plurality of holes (b) 2b at desired portions through the insulating substrate 1 and the circuit conductors 3, a plurality of circuit conductors (a) 4a formed on the whole inner walls of the holes (a) 2a and a part of surfaces of the insulating substrate around the holes (a) 2a in connection with the inner wall of holes (a) 2a, and a plurality of circuit conductors (b) 4b formed on the whole inner walls of the holes (b) 2b and a part of the circuit conductors 3 formed on the insulating substrate 1 around the holes (b) in connection with the inner wall of holes (b) 2b. The important thing is that the wiring board has both holes (a) and holes (b) having different electrical connection structures.

Figure 2A:
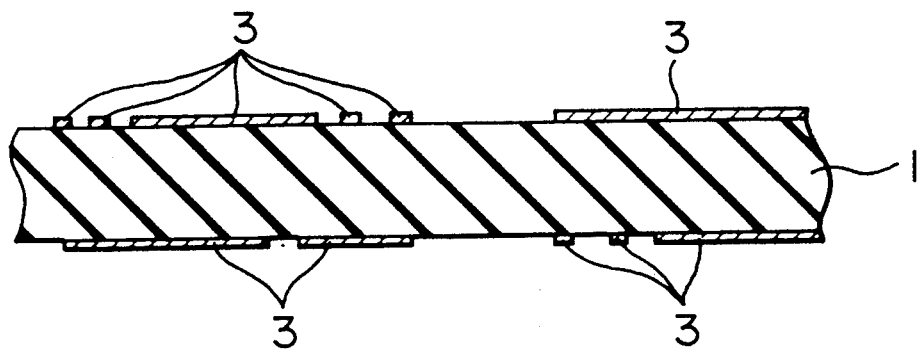
FIGS. 2(A) to 2(F) are cross-sectional views explaining one example of the processes of the present invention.
Figure 2B:
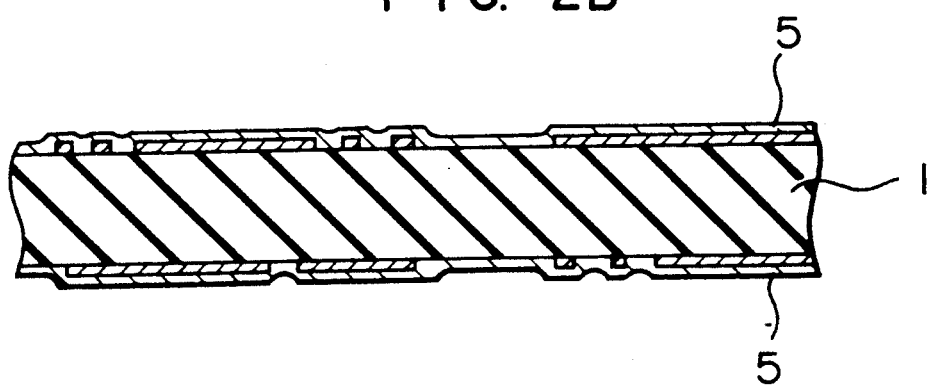
Figure 2C:
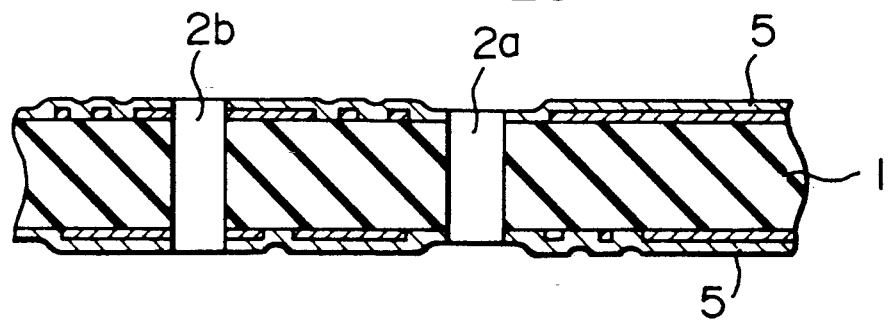
Figure 2D:
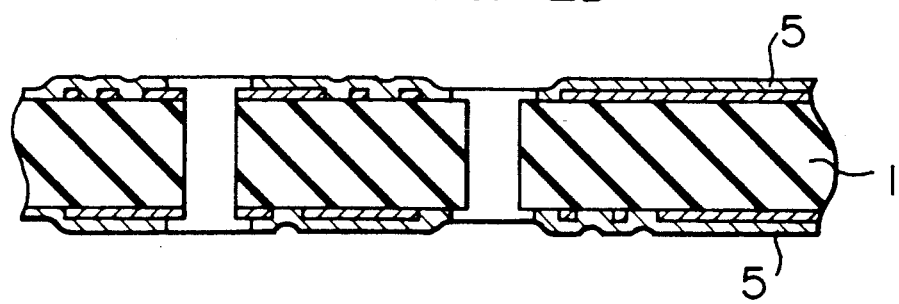
Figure 2E:
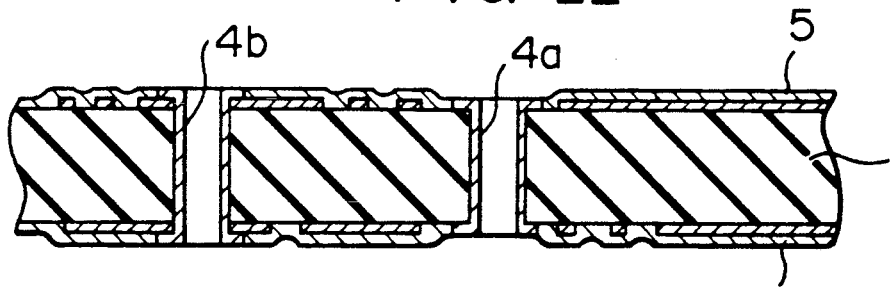
Figure 2F:
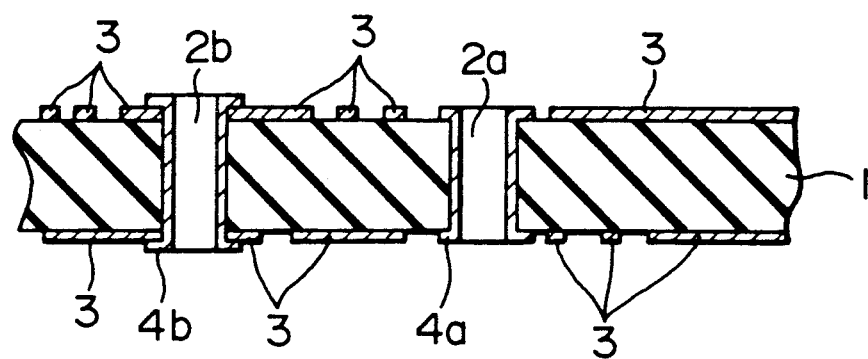

Such a wiring board can be produced by the following process comprising:

1-A: a step of forming a plurality of desired circuit conductors 3 on surfaces of the insulating film 1 (FIG. 2(A)), 1-B: a step of forming a protective film 5 on the whole surfaces of the insulating substrate 1 having the circuit conductors 3 (FIG. 2(B)), 1-C: a step of drilling or punching the holes (a) 2a and the holes (b) 2b (FIG. 2(C)), 1-D: a step of removing the protective film 5 around the holes (a) and the holes (b) in a desired range (FIG. 2(D)), 1-E: a step of forming conductors (a) 4a and conductors (b) 4b on the whole inner walls of the holes (a) 2a and holes (b) 2b and the portions from which the protective film 5 has been removed in the step 1-D (FIG. 2(E)), and 1-F: a step of removing the rest of the protective film 5 (FIG. 2(F)).

In the process of the present invention, it is a very surprising thing to produce a wiring board having holes (a) and holes (b) with different electrical connection structures easily and economically.

Figure 3:
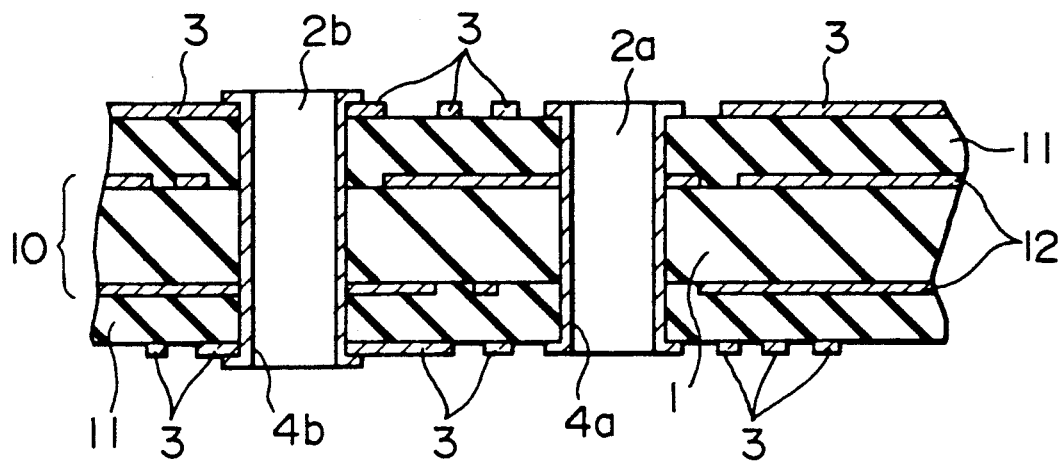
FIG. 3 is a cross-sectional view of another example of the wiring boards of the present invention.

In the wiring board mentioned above, it is possible to use an insulating substrate 1 and an inner circuit board 10 having a plurality of insulating boards 11 and a plurality of inner circuits 12 in place of the insulating substrate 1. In such a case, the wiring board takes a structure as shown in FIG. 3 comprising an inner circuit board 10 having inner circuits 12, insulating boards 11 formed on both sides of inner circuit board, circuit conductors 3 formed on individual surfaces of the insulating boards 11, at least one hole (a) 2a formed at a desired portion of the insulating substrate 1 through the insulating boards 11 and the inner circuit board 10, at least one hole (b) 2b formed at a desired portion of the insulating substrate 1 through the insulating boards 11, the inner circuit board 10, and the circuit conductors 3, at least one circuit conductor (a) 4a formed on the whole inner wall of the hole (a) 2a and a part of surfaces of the insulating boards 11 in connection with the inner wall of the hole (a) 2a, and at least one circuit conductor (b) 4b formed on the whole inner wall of the hole (b) 2b and a part of the surfaces of the circuit conductors 3 formed on the insulating boards 11 in connection with the inner wall of the hole (b) 2b.

Figure 4A:
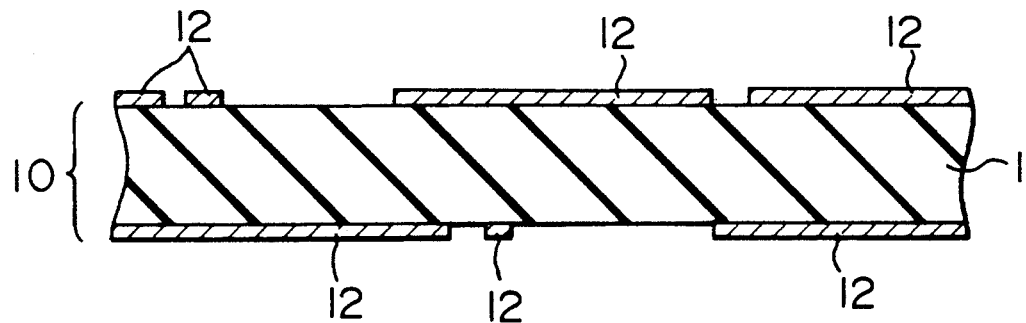
FIGS. 4(A) to 4(G) are cross-sectional views explaining another example of the processes of the present invention.
Figure 4B:
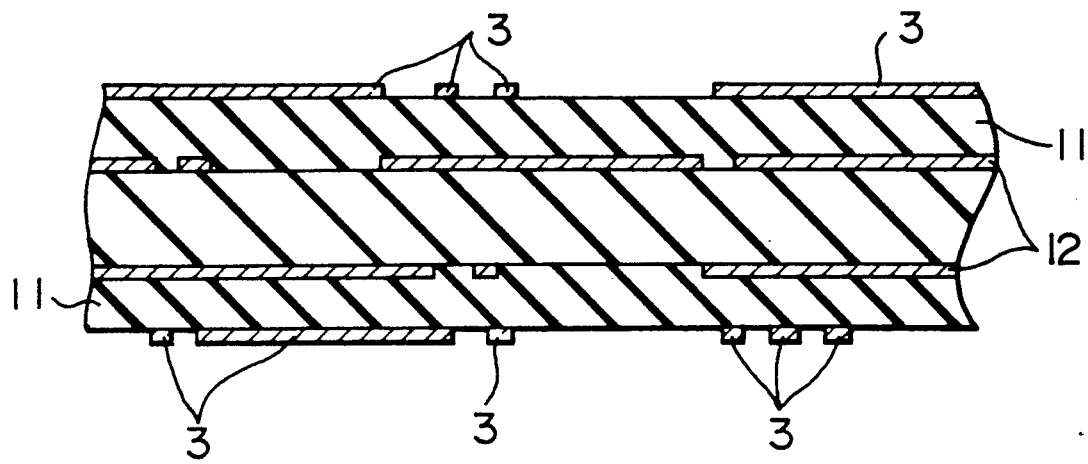
Figure 4C:
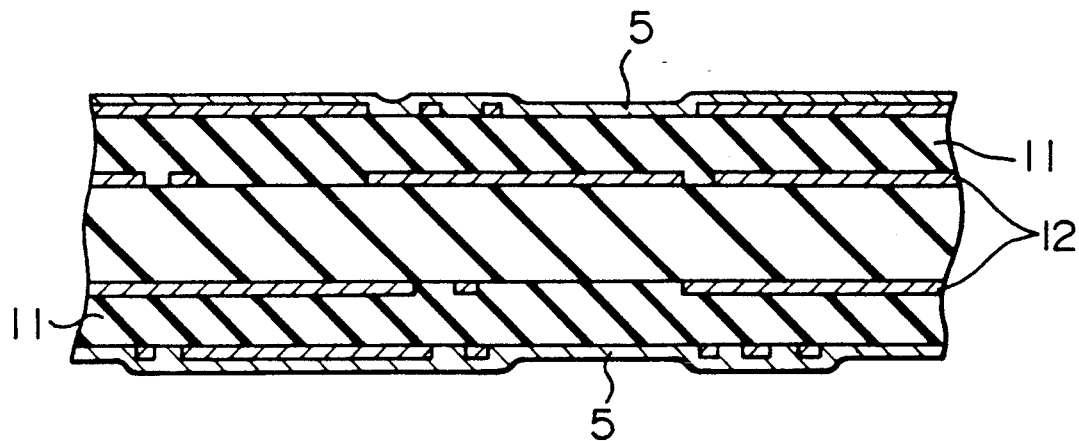
Figure 4D:
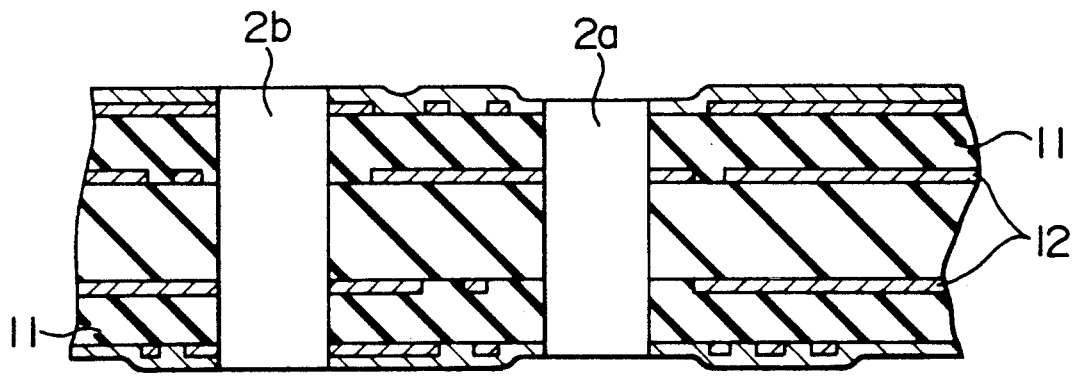
Figure 4E:
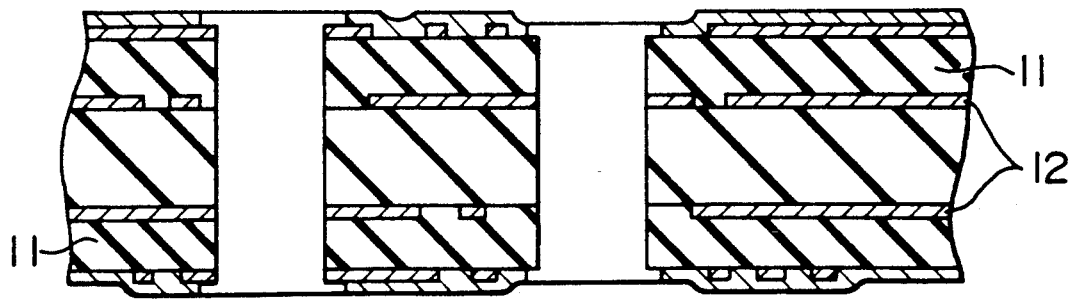
Figure 4F:
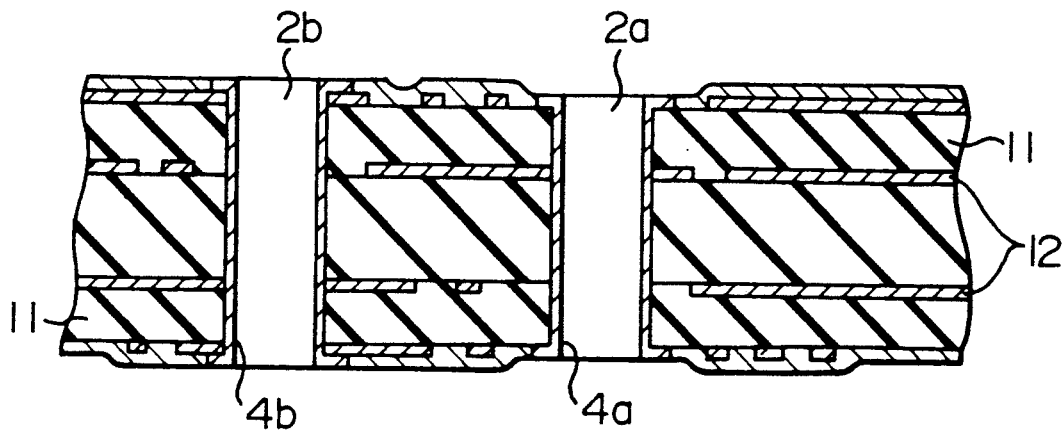
Figure 4G:
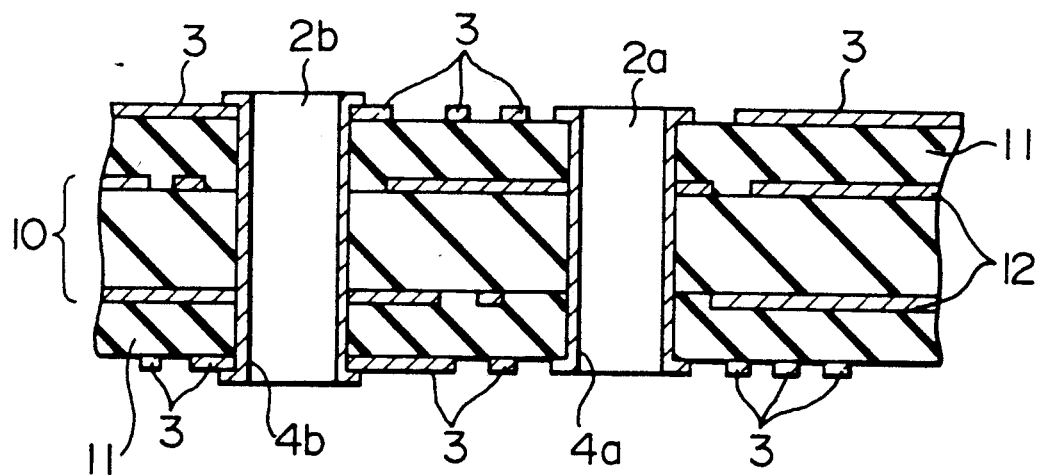

Such a wiring board can be produced by the following process comprising:

2-A: a step of forming inner circuits 12 on surfaces of an insulating substrate 1 to make an inner circuit board 10 (FIG. 4(A)), 2-B: a step of forming insulating boards 11 on surfaces of the inner circuit board 10 and forming desired circuit conductors 3 on surfaces of the insulating boards 11 (FIG. 4(B)), 2-C: a step of forming a protective film 5 on the whole surfaces of the insulating boards 11 having the circuit conductors 3 (FIG. 4(C)), 2-D: a step of drilling or punching at least one hole (a) 2a and at least one hole (b) 2b (FIG. 4(D)), 2-E: a step of removing the protective film 5 around the hole (a) 2a and the hole (b) 2b in a desired range (FIG. 4(E)), 2-F: a step of forming a circuit conductor (a) 4a and a circuit conductor (b) 4b on the whole inner walls of the hole (a) 2a and hole (b) 2b and the portions from which the protective film has been removed in the step 2-E (FIG. 4(F)), and 2-G: a step of removing the rest of the protective film 5 (FIG. 4(G)).

As the protective film 5 used in the step 1-B or 2-C, there can be used liquid, powdery or film-like conventional resins such as acrylic resins, polyester resins, polyethylenes, polypropylenes, polyvinyl chlorides, polytetrafluoroethylenes, etc.

The protective film 5 can be form by a conventional method such as roll coating, curtain coating, dip coating, fluidized bed coating, or laminating.

Figure 5:
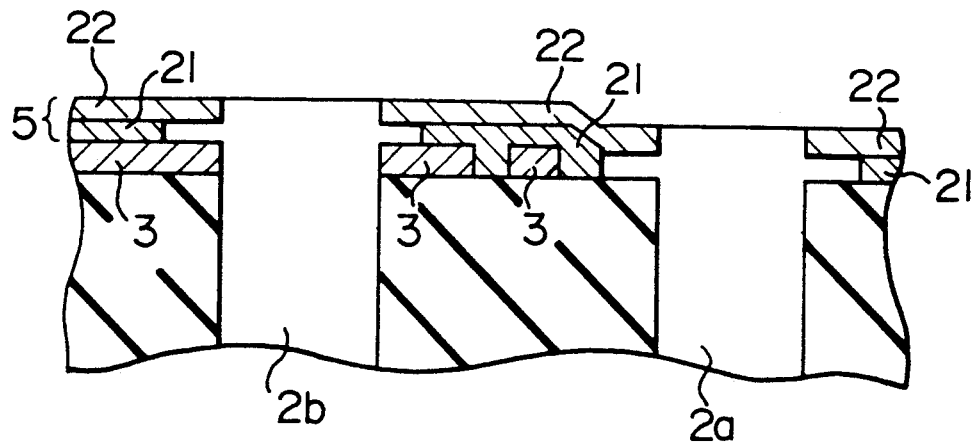
FIG. 5 is a cross-sectional view of a further example of the wiring boards of the present invention.
Figure 6A:
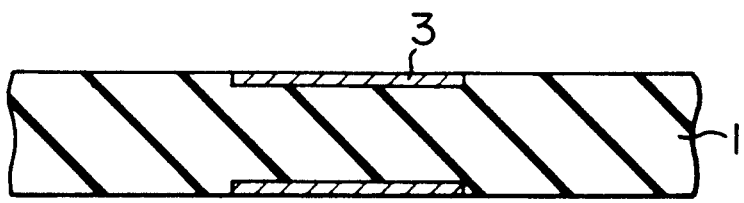
FIGS. 6(A) to 6(D) are cross-sectional views explaining one example of known processes.
Figure 6B:
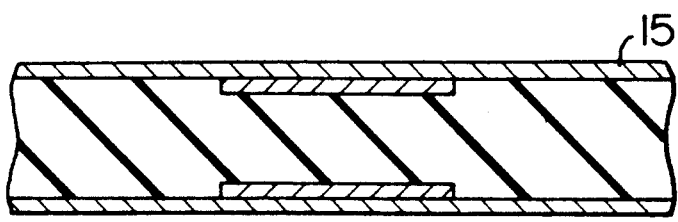
Figure 6C:
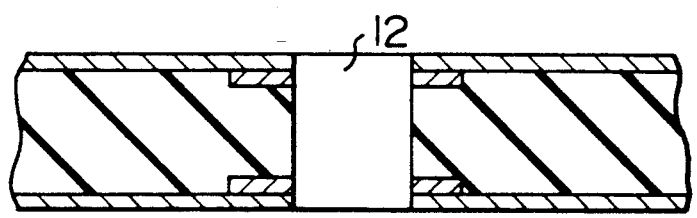
Figure 6D:
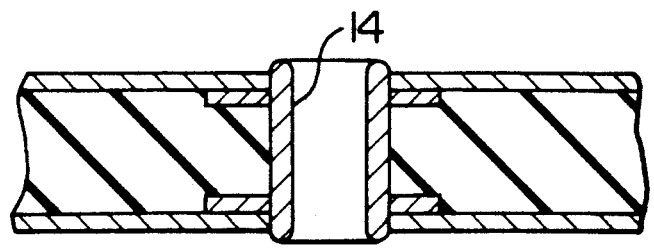
Figure 7A:
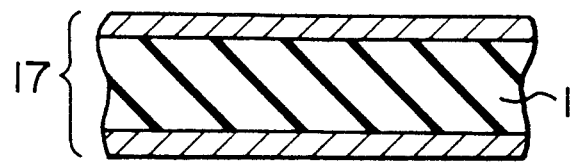
FIGS. 7(A) to 7(E) are cross-sectional views explaining another example of known processes.
Figure 7B:
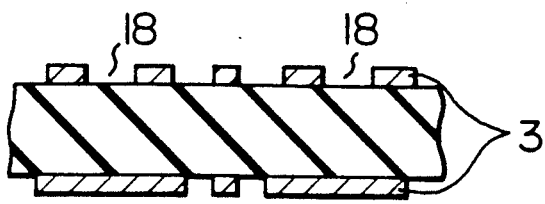
Figure 7C:
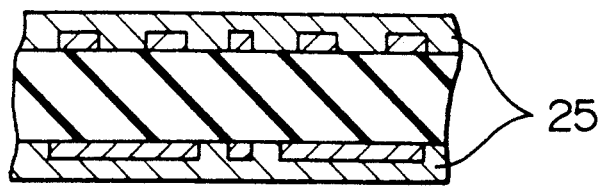
Figure 7D:
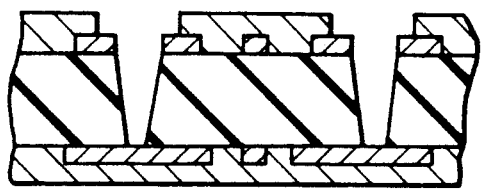
Figure 7E:
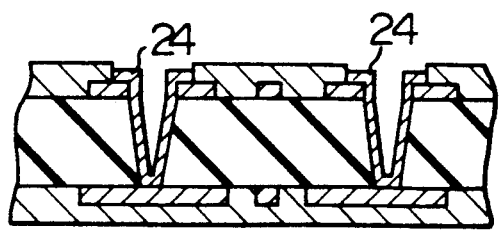

It is possible to use a composite film obtained by laminating two or more films having different solubilities for one kind of a removing solution as the protective film 5. In such a case, when a film having a higher solubility is placed near the insulating substrate 1, holes are formed by the step 1-C or 2-D, and the resulting substrate is dipped in or sprayed with a removing solution, the protective film around the holes can easily be removed selectively as shown in FIG. 5. Such a protective film 5 is a combination of an acrylate resin film 21 and a polyester resin film 22.

As an agent for selectively removing the acrylate resin, there can be used trichloroethane, trichloroethylene, methylene chloride, etc.

A composite structure of acrylate resin and polyester resin can be available commercially under a name of Resist Film PHT 347 for electroless plating (mfd. by Hitachi Chemical Co., Ltd.).

Removal of the protective film 5 around the holes (a) 2a and the holes (b) 2b in the desired range can be carried out chemically using the removing agent (or solution) mentioned above or mechanically by jetting water containing abrasive grains.

The range of the removal of the protective film 5 is preferable when the contacting area between the insulating substrate 1 or the insulating board 11 and the conductor (a) 4a, and the connecting area between the conductor (b) 4b and the circuit conductor 3 become larger. When the range is 0.01 mm or more, the connection reliability becomes the same or higher compared with that obtained by a known subtractive process. In order to keep the distance between the circuit conductor 3 and a neighboring circuit conductor sufficient and not making narrower, the range of 0.5 mm or less is preferable.

In the case of a multi-layer wiring board according to the present invention, there can be obtained the following advantages compared with a known method wherein only one kind of hole (a) or (b) is present. That is, the circuit conductor (a) 4a can directly connect the inner circuit 12 with an electronic part, and the circuit conductor (b) 4b can connect the inner circuit 12 with the surface circuit 3 and an electronic part. When only the circuit conductor (a) is formed according to a known process, it is necessary to place a small conductor (pad) on a surface of the insulating board 11 for connection. In contrast, according to the present invention, since the circuit conductor (b) 4b is simultaneously formed together with the circuit conductor (a) 4a, the use of such a pad is not necessary, which results in making the wiring density higher due to the vacant space of the pad.

The circuit conductors (a) and (b) 4a and 4b can be formed by a method of coating an electroconductive ink or a method of depositing a metal by electroless plating. As the metal, the use of copper, nickel, etc. having higher electroconductivity is preferable. Further, electroless plating is more preferable.

As the insulating substrate or board, there can be used conventional ones such as glass cloth impregnated with an epoxy resin, paper/epoxy resin, glass composite/epoxy resin (glass composite containing glass short fibers), paper/phenol resin, etc.

According to the present invention, the wiring board has a structure wherein the connecting area between through-holes and circuit conductors extends not only to the cross-section of through-hole portion of the circuit conductor but also to the circuit conductor of through-hole portion, so that the connecting area becomes larger compared with the known one. Further, the use of pads which are used in known wiring boards is not necessary on portions wherein the fixing of electronic parts is only aimed at and connection of the electronic parts and circuit conductors is not necessary, or portions only connected with inner circuits in multi-layer circuits. Therefore, the wiring design of circuit conductors becomes easy.

Further, in the process for producing the wiring board of the present invention, since drilling or punching of holes can be conducted after forming all the circuit conductors, the steps can be simplified. In addition, it is not necessary to consider an error for adjusting the hole location at the time of fabricating circuits.

The present invention is illustrated by way of the following Examples.

EXAMPLE 1

As an insulating substrate, a copper-clad laminate MCL-E-67 (mfd. by Hitachi Chemical Co., Ltd.) wherein glass cloth was impregnated with epoxy resin was used. On both sides of the insulating substrate, an ultraviolet curing type etching resist acrylic resin film (PHT 864, a trade name, mfd. by Hitachi Chemical Co., Ltd.) was laminated, followed by adhesion of a photomask transmitting light in a desired pattern on the etching resist film. After irradiating ultraviolet rays and development to form a desired etching pattern, an etching solution of cuppic chloride was sprayed to remove unnecessary copper foils by etching for forming the desired circuit conductors.

Then, a composite resist for electroless plating (PHT 347, a trade name, mfd. by Hitachi Chemical Co., Ltd.) comprising an acrylate resin film and a polyester resin film was laminated on the surfaces of circuit conductor formed laminate using a vacuum laminator, followed by drilling through-holes 2a and 2b as shown in FIG. 1 at desired positions using a drilling machine.

The surfaces of the drilled laminate were polished by jetting water containing abrasive grains of 240 mesh and at the same time the plating resist was removed from peripheries of the holes in the range of 0.05 mm in average from the brim of holes.

After seeding a catalyst ($PdCl_2$) in the holes, treatment with an electroless copper plating solution (CC-41, a trade name, mfd. by Hitachi Chemical Co., Ltd.) was conducted to deposit copper in an average thickness of 0.04 mm.

Then, the electroless plating resist was removed by dipping in methylene chloride at 40° C. for 40 seconds to produce a wiring board.

EXAMPLE 2

As an insulating substrate, a copper-clad laminate MCL-E-168 (mfd. by Hitachi Chemical Co., Ltd.) wherein glass cloth was impregnated with epoxy resin containing a catalyst for electroless copper plating was used. On both sides of the insulating substrate, an ultraviolet curing type etching resist (acrylic resin, PHT 864, mfd. by Hitachi Chemical Co., Ltd.) was laminated, followed by adhesion of a photomask transmitting light in a desired pattern on the etching resist film. After irradiating ultraviolet rays and development to form a desired etching pattern, an etching solution of cupric chloride was sprayed to remove unnecessary copper foils by etching for forming the desired circuit conductors.

Then, an electroless plating resist PHT 347 (a trade name, mfd. by Hitachi Chemical Co., Ltd.) was laminated on the surfaces of circuit conductor formed laminate, followed by drilling of through-holes 2a and 2b as shown in FIG. 1 at desired positions using a drilling machine.

The surfaces of the drilled laminate were sprayed with methylene chloride at room temperature for 30 seconds to remove the acrylate resin portion of the electroless plating resist PHT 347 in the range of 0.05 mm in average from the brim of holes by dissoltuion.

After treatment with an electroless copper solution (CC-41, a trade name, mfd. by Hitachi Chemical Co., Ltd.), copper was deposited in average thickness of 0.04 mm, followed by removal of the electroless plating resist by dipping in methylene chloride at 40° C. for 40 seconds to produce a wiring board.

EXAMPLE 3

An inner circuit board was prepared as follows. A copper-clad laminate MCL-E-168 (a trade name, mfd. by Hitachi Chemical Co., Ltd.) wherein glass cloth was impregnated with epoxy resin containing a catalyst for electroless copper plating was used. On both sides of the inner circuit board, an ultraviolet curing type etching resist PHT 864 (mfd. by Hitachi Chemical Co., Ltd.) was laminated, followed by adhesion of a photomask transmitting light in a desired pattern on the etching resist film. After inadiating ultraviolet rays and development to form a desired etching pattern, an etching solution of cuppric chloride was sprayed to remove unnecessary copper foils by etching for forming the desired circuit conductors. Three resulting laminates were laminated alternately with prepregs GE 168N (a trade name, mfd. by Hitachi Chemical Co., Ltd.) wherein glass cloth was impregnated with epoxy resin containing a catalyst for electroless copper plating, followed by heating and pressing to make the laminated layers into one body.

Then, an electroless plating resist PHT 347 (a trade name, mfd. by Hitachi Chemical Co., Ltd.) was laminated on the surfaces of the resulting inner circuit board using a vacuum laminator, followed by drilling of through-holes (a) 2a and (b) 2b as shown in. FIG. 4(D) at desired positions using a drilling machine.

The surfaces of the drilled laminate were sprayed with methylene chloride at room temperature for 30 seconds to remove the acrylate resin portion of the electroless plating resist PHT 347 in the range of 0.05 mm in average from the brim of holes by dissolution.

After treatment with an electroless copper solution (CC-41, a trade name, mfd. by Hitachi Chemical Co., Ltd.), copper was deposited in average thickness of 0.04 mm, followed by removal of the electroless plating resist by dipping in methylene chloride at 40° C. for 40 seconds to produce a wiring board.

EXAMPLE 4

As an insulating substrate, a copper-clad laminate MCL-E-67 (mfd. by Hitachi Chemical Co., Ltd.) wherein glass cloth was impregnated with an epoxy resin was used. On both sides of the insulating substrates, an ultraviolet curing type etching resist film PHT 864 (mfd. by Hitachi Chemical Co., Ltd.) was laminated, followed by adhesion of a photomask transmitting light in a desired pattern on the etching resist film. After irradiating ultraviolet rays and development to form a desired etching pattern, an etching solution of cuppric chloride was sprayed to remove unnecessary copper foils by etching for forming the desired circuit conductors.

Then, a polypropylene pressure-sensitive adhesive film was adhered to the surfaces of circuit conductor formed laminate with heating and pressing, followed by drilling through-holes (a) 2a and (b) 2b as shown in FIG. 1 at desired positions using a drilling machine.

The surfaces of the drilled laminate were polished by jetting water containing adhesive grains of 240 mesh and at the same time the plating resist was removed from peripheries of the holes in the range of 0.05 mm in average from the brim of holes.

After seeding a catalyst ($PdCl_2$) in the holes, treatment with an electroless copper plating solution (CC-41, a trade name, mfd. by Hitachi Chemical Co., Ltd.) was conducted to deposit copper in an average thickness of 0.04 mm.

Then, the polypropylene pressure-sensitive adhesive film was peeled using a polishing apparatus to produce a wiring board.

COMPARATIVE EXAMPLE 1

As an insulating substrate, a copper-clad laminate MCL-E-67 (mfd. by Hitachi Chemical Co., Ltd.) wherein glass cloth was impregnated with epoxy resin was used. On both sides of the insulating substrate, an ultraviolet curing type etching resist film PHT 864 (mfd. by Hitachi Chemical Co., Ltd.) was laminated, followed by adhesion of a photomask transmitting light in a desired pattern on the etching resist film. After irradiating ultraviolet rays and development to form a desired etching pattern, an etching solution of cuppric chloride was sprayed to remove unnecessary copper foils by etching for forming the desired circuit conductors.

Then, a resist for electroless plating (PHT 347, a trade name, mfd. by Hitachi Chemical Co., Ltd.) was laminated on the surfaces of circuit conductor formed laminate using a vacuum laminator, followed by drilling through-holes at desired position using a drilling, machine.

After seeding a catalyst ($PdCl_2$) in the through-holes without removing the plating resist around the through-holes, treatment with an electroless copper plating solution (CC-41, a trade name, mfd. by Hitachi Chemical Co., Ltd.) was conducted to deposit copper in an average thickness of 0.04 mm.

Then, the electroless plating resist was removed by dipping in methylene chloride at 40° C. for 40 seconds to produce a wiring board.

The wiring boards thus produced in Examples 1 to 4 and Comparative Example 1 were subjected to a test for examining connection reliability according to MIL-STD-107 by conducting a heating-cooling repeating test (one cycle: 120° C., 30 minutes room→temperature, 5 minutes →−65° C., 30 minutes→room temperature, 5 minutes).

The results are shown in Table 1, wherein numbers of repetition of the heating and cooling until -breakage of wiring are shown.

TABLE 1

| Example No. | Number of repetition of heating and cooling |
| --- | --- |
| Example 1 | 1020 |
| Example 2 | 1300 |
| Example 3 | 1400 |
| Example 4 | 1050 |
| Comparative | 320 |

TABLE 1-continued

| Example No. | Number of repetition of heating and cooling |
| --- | --- |
| Example 1 | |

As explained above, according to the present invention, wiring boards with excellent connection reliability and high wiring density can be obtained.

What is claimed is:

1. A wiring board comprising an insulating substrate, circuit conductors formed on both sides of the insulating substrate, at least one hole (a) formed at a desired portion only through the insulating substrate, a circuit conductor (a) formed on the whole inner wall of the hole (a) and a part of surfaces of the insulating substrate around the hole (a) in the range of 0.01 mm to 0.5 mm from the rim of the hole (a) in connection with the inner wall of hole (a), at least one hole (b) formed at a desired portion through the insulating substrate and the circuit conductors formed on the insulating substrate, and a circuit conductor (b) formed on the whole inner wall of the hole (b) and a part of the circuit conductors formed on the insulating substrate around the hole (b) in the range of 0.01 mm to 0.5 mm from the rim of the hole (b) in connection with the inner wall of hole (b); the hole (a) and the hole (b) having different electrical connection structures on surfaces of the insulating substrate.

2. A wiring board comprising an inner circuit board having inner circuits, insulating boards formed on both sides of the inner circuit board, circuit conductors formed on individual surfaces of the insulating boards, at least one hole (a) formed at a desired portion of the insulating substrate through the insulating boards and the inner circuit board, at least one hole (b) formed at a desired portion of the insulating substrate through the insulating boards, the inner circuit board, and the circuit conductors, at least one circuit conductor (a) formed on the whole inner wall of the hole (a) and a part of surfaces of the insulating boards around the hole (a) in a range of 0.01 mm to 0.5 mm from the rim of the hole (a) in connection with the inner wall of the hole (a), and at least one circuit conductor (b) formed on the whole inner wall of the hole (b) and a part of the surfaces of the circuit conductors formed on the insulating boards around the hole (b) in a range of 0.01 mm to 0.5 mm from the rim of the hole (b) in connection with the inner wall of the hole (b); the hole (a) and the hole (b) having different electrical connection structures on surfaces of the insulating boards.

* * * * *